(12) United States Patent
Hase

(10) Patent No.: US 12,463,606 B2
(45) Date of Patent: Nov. 4, 2025

(54) POWER AMPLIFIER CIRCUIT

(71) Applicant: Murata Manufacturing Co., Ltd., Kyoto (JP)

(72) Inventor: Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 485 days.

(21) Appl. No.: 18/053,801

(22) Filed: Nov. 9, 2022

(65) Prior Publication Data

US 2023/0155558 A1 May 18, 2023

(30) Foreign Application Priority Data

Nov. 16, 2021 (JP) .................. 2021-186221

(51) Int. Cl.
*H03F 3/21* (2006.01)
*H03F 3/213* (2006.01)

(52) U.S. Cl.
CPC ............ *H03F 3/211* (2013.01); *H03F 3/213* (2013.01); *H03F 2200/369* (2013.01); *H03F 2200/451* (2013.01)

(58) Field of Classification Search
CPC ....... H03F 1/32; H03F 3/245; H03F 2200/451
USPC ...................................................... 330/296
See application file for complete search history.

(56) References Cited

U.S. PATENT DOCUMENTS

2020/0220504 A1*  7/2020  Zhao .................... H03F 1/34

FOREIGN PATENT DOCUMENTS

JP        2021-013055 A        2/2021

OTHER PUBLICATIONS

Yang et al., A 5-GHz Band WLAN SiGe HBT Power Amplifier IC with Novel Adaptive-Linearizing CMOS Bias Circuit © IEEE 2015 (Year: 2015).*

* cited by examiner

*Primary Examiner* — Hafizur Rahman
(74) *Attorney, Agent, or Firm* — McDonald Hopkins LLC (57) ABSTRACT

A power amplifier circuit includes amplifying transistors electrically cascade-connected, amplifying a signal supplied to a base, and outputting an amplified signal; a first resistive element having end parts connected to the base of a first amplifying transistor; a second resistive element having end parts connected to the base of a second amplifying transistor, which is an amplifying transistor located closer to an input side than the first amplifying transistor; a first bias supplying transistor having an emitter connected to one of the end parts of the first resistive element; a second bias supplying transistor having an emitter connected to one of the end parts of the second resistive element; and a bias current compensation transistor having a base connected to the end part of the first resistive element, a collector connected to the end part of the second resistive element, and an emitter connected to ground.

12 Claims, 9 Drawing Sheets

POWER AMPLIFIER CIRCUIT

CROSS REFERENCE TO RELATED APPLICATION

This application claims priority from Japanese Patent Application No. 2021-186221 filed on Nov. 16, 2021. The content of this application is incorporated herein by reference in its entirety.

BACKGROUND ART

The present disclosure relates to power amplifier circuits.

There is a power amplifier circuit in which amplifying operations of four transistors are controlled by three control currents that are respectively supplied to three control terminals (for example, see Japanese Unexamined Patent Application Publication No. 2021-13055 (Patent Document 1)).

BRIEF SUMMARY

In a power amplifier circuit described in Patent Document 1 (see FIG. 9), a control current IB2 is supplied to a base of a transistor T7b of a bias circuit 111A through a resistive element R5b. When the control current IB2 is at a high level, the transistor T7b is turned ON, and a bias current Ibias2 is supplied to a base of a transistor T2 from an emitter of the transistor T7b through a resistive element R2. This turns the transistor T2 ON.

Figure 9:
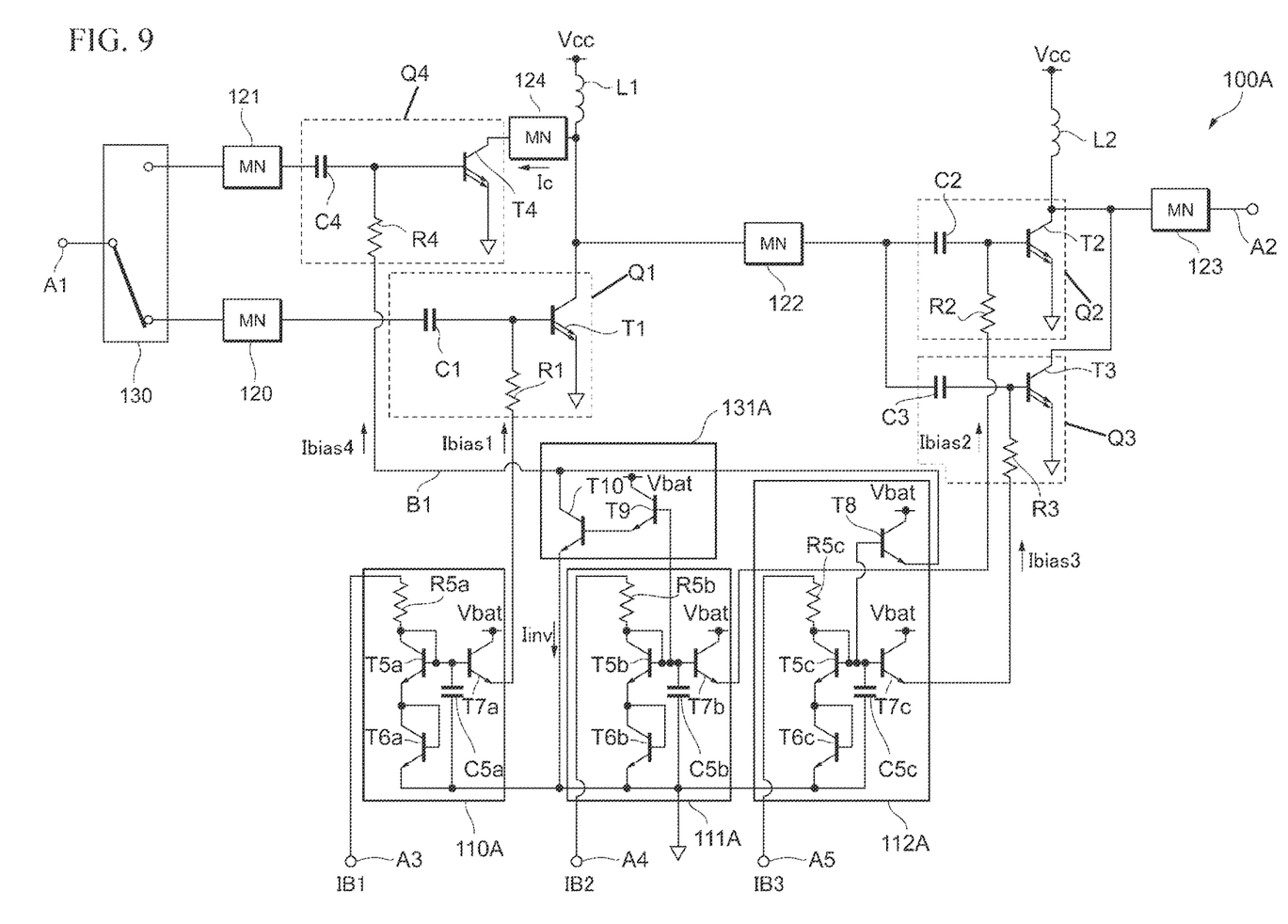
FIG. 9 is a diagram illustrating a typical configuration of a power amplifier circuit.

A transistor T8 of a bias circuit 112A supplies a bias current Ibias4 to a transistor T4 of an amplifier Q4. A switch circuit 131A is provided between a ground and a path B1 through which the bias current Ibias4 is supplied from the bias circuit 112A to the amplifier Q4.

The switch circuit 131A operates based on a base potential of the transistor T7b. Specifically, when the control current IB2 is at the high level, the base potential of the transistor T7b rises, and the switch circuit 131A is turned ON. In this case, as described above, the transistor T2 is also turned ON.

When the switch circuit 131A is ON, the switch circuit 131A causes part of the bias current Ibias4, which is to be supplied to the amplifier Q4 from the bias circuit 112A, to flow into the ground. Because of this, even when the transistor T8 is ON, if the transistor T7b is ON, that is to say, if the transistor T2 is ON, the state of the transistor T4 of the amplifier Q4 becomes close to OFF.

Incidentally, there are cases where the gain of the transistor T2 changes depending on the input power to the transistor T2. In such cases, in the power amplifier circuit described in Patent Document 1, the overall gain of the circuit changes depending on the input power.

The switch circuit 131A operates based on the base potential of the transistor T7b, which is based on nonlinearity of the transistor T2 and nonlinearity of the transistor T7b. Therefore, even if the switch circuit 131A draws out the bias current Ibias4 and as a result the gain of the transistor T4 changes, the gain change of the transistor T2 cannot be fully compensated. That is to say, it is difficult to suppress the change in the overall gain of the power amplifier circuit described in Patent Document 1.

The present disclosure provides a power amplifier circuit capable of suppressing the change in gain.

A power amplifier circuit according to one aspect of the present disclosure includes: a plurality of amplifying transistors including at least a first amplifying transistor and a second amplifying transistor, the plurality of amplifying transistors being electrically cascade-connected, each of the plurality of amplifying transistors amplifying a signal supplied to a base or gate thereof and outputting an amplified signal; a first resistive element having a first end part and a second end part connected to the base or gate of the first amplifying transistor; a second resistive element having a first end part and a second end part connected to the base or gate of the second amplifying transistor; a first bias supplying transistor having an emitter or source connected to the first end part of the first resistive element; a second bias supplying transistor having an emitter or source connected to the first end part of the second resistive element; and a bias current compensation transistor having a base or gate connected to the first end part of the first resistive element, a collector or drain connected to the first end part of the second resistive element, and an emitter or source connected to ground.

According to the present disclosure, it becomes possible to provide a power amplifier circuit capable of suppressing the change in the gain.

DETAILED DESCRIPTION

Hereinafter, embodiments of the present disclosure will be described in detail with reference to the drawings. Same reference characters are given to same constituent elements, and overlapping descriptions are omitted as much as possible.

First Embodiment

Figure 1:
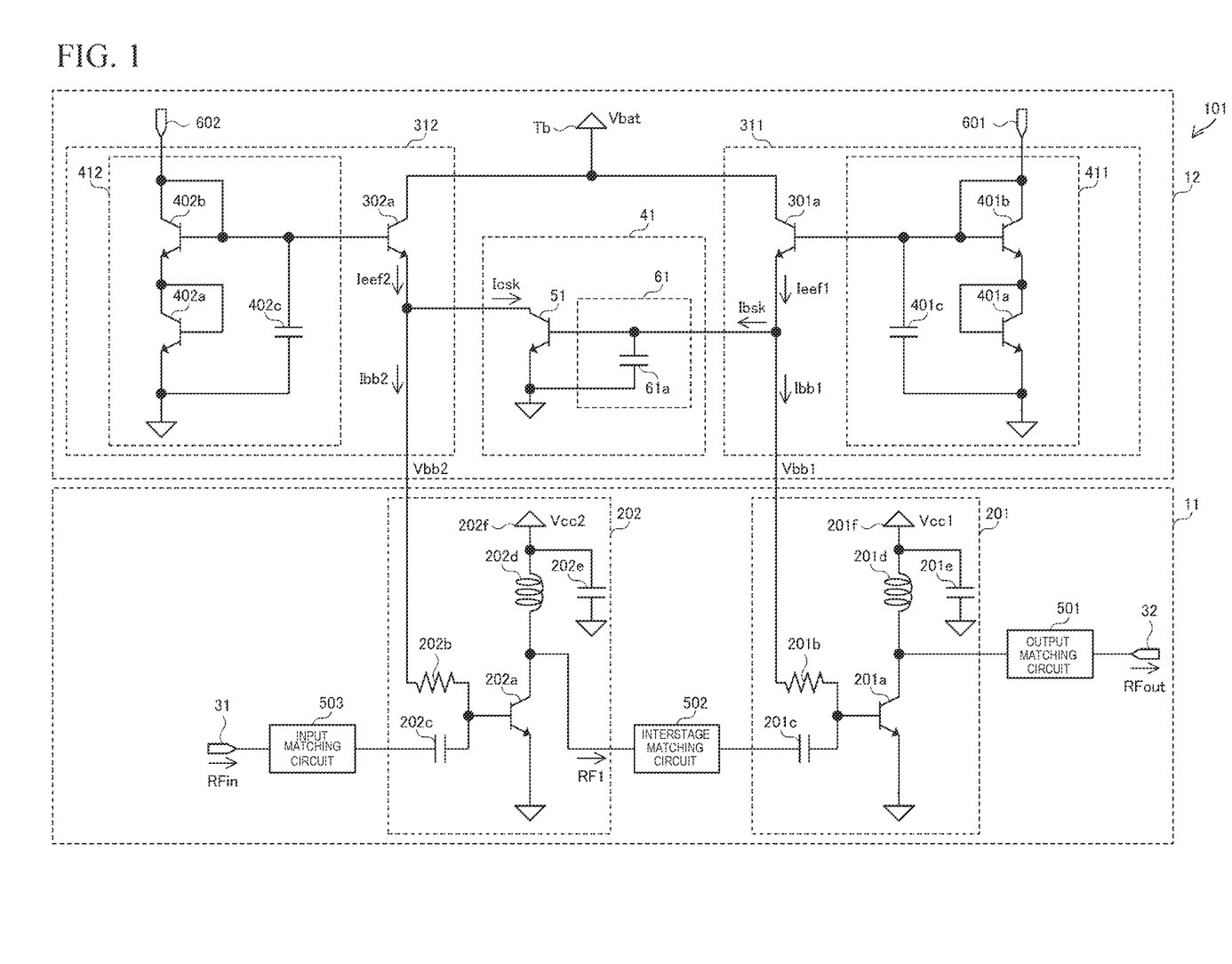
FIG. 1 is a circuit diagram of a power amplifier circuit 101.

A power amplifier circuit according to the first embodiment is described. FIG. 1 is a circuit diagram of a power amplifier circuit 101. As illustrated in FIG. 1, the power amplifier circuit 101 according to the first embodiment includes a multistage amplifier 11 and a bias part 12. The multistage amplifier 11 includes a final stage amplifier 201, a first stage amplifier 202, an output matching circuit 501, an interstage matching circuit 502, and an input matching circuit 503. The bias part 12 includes a bias current control circuit 41, a final stage bias circuit 311, and a first stage bias circuit 312.

Multistage Amplifier 11

The multistage amplifier 11 is a circuit that amplifies an input signal (radio frequency signal) RFin supplied to an input terminal 31 and outputs an output signal (amplified signal) RFout from an output terminal 32.

The input matching circuit 503 of the multistage amplifier 11 is a circuit that provides impedance matching between the first stage amplifier 202 and a circuit in a stage preceding the multistage amplifier 11, and allows the input signal RFin to pass. The first stage amplifier 202 amplifies the input signal RFin, which is supplied from the input terminal 31 through the input matching circuit 503, and outputs an amplified signal RF1 to the interstage matching circuit 502.

The interstage matching circuit 502 is a circuit that provides impedance matching between the first stage amplifier 202 and the final stage amplifier 201 and allows the amplified signal RF1 to pass. The final stage amplifier 201 amplifies the amplified signal RF1, which is supplied from the first stage amplifier 202 through the interstage matching circuit 502, and outputs the output signal RFout to the output matching circuit 501.

The output matching circuit 501 is a circuit that provides impedance matching between the final stage amplifier 201 and a circuit in a stage subsequent to the multistage amplifier 11 and allows the output signal RFout to pass.

In the following section, the first stage amplifier 202 is described in detail. The first stage amplifier 202 includes an amplifying transistor 202a (second amplifying transistor), a resistive element 202b (second resistive element), capacitors 202c and 202e, and an inductor 202d.

The present embodiment is described assuming that the transistors such as the amplifying transistor 202a and the like are each formed of, for example, a bipolar transistor such as a heterojunction bipolar transistor (HBT) or the like. Alternatively, the transistors such as the amplifying transistor 202a and the like may each be formed of another transistor such as a field-effect transistor (MOSFET: Metal-oxide-semiconductor Field-Effect Transistor) or the like. In that case, the base, the collector, and the emitter may be replaced with the gate, the drain, and the source, respectively.

A power voltage Vcc2 of the amplifying transistor 202a is supplied to a terminal 202f. The capacitor 202c has a first end part connected to the input terminal 31 through the input matching circuit 503 and a second end part.

The amplifying transistor 202a has a base connected to the second end part of the capacitor 202c, a collector connected to the terminal 202f through the inductor 202d, and an emitter connected to the ground.

The capacitor 202e has a first end part connected to the terminal 202f and a second end part connected to the ground. The resistive element 202b has a first end part connected to the first stage bias circuit 312 and a second end part connected to the base of the amplifying transistor 202a.

In the following section, the final stage amplifier 201 is described in detail. The final stage amplifier 201 includes an amplifying transistor 201a (first amplifying transistor and final stage amplifying transistor), a resistive element 201b (first resistive element), capacitors 201c and 201e, and an inductor 201d.

A power voltage Vcc1 of the amplifying transistor 201a is supplied to a terminal 201f. The capacitor 201c has a first end part connected to the collector of the amplifying transistor 202a through the interstage matching circuit 502 and a second end part.

The amplifying transistor 201a has a base connected to the second end part of the capacitor 201c, a collector connected to the terminal 201f through the inductor 201d and further connected to the output terminal 32 through the output matching circuit 501, and an emitter connected to the ground.

The capacitor 201e has a first end part connected to the terminal 201f and a second end part connected to the ground. The resistive element 201b has a first end part connected to the final stage bias circuit 311 and a second end part connected to the base of the amplifying transistor 201a.

Bias Part 12

The bias part 12 supplies a bias to each of the final stage amplifier 201 and the first stage amplifier 202 of the multistage amplifier 11 in such a manner as to suppress the change in the gain of the power amplifier circuit 101.

The final stage bias circuit 311 of the bias part 12 includes a bias supplying transistor 301a (first bias supplying transistor) and a voltage applying circuit 411. The voltage applying circuit 411 includes transistors 401a (first transistor) and 401b (second transistor) and a capacitor 401c.

The final stage bias circuit 311 supplies a bias current Ibb1 to the base of the amplifying transistor 201a using the bias supplying transistor 301a that is connected to the base of the amplifying transistor 201a in an emitter-follower configuration.

Specifically, the bias supplying transistor 301a has a collector connected to a terminal Tb that supplies a battery voltage Vbat, a base, and an emitter connected to the first end part of the resistive element 201b.

The voltage applying circuit 411 supplies a bias at a predetermined level of voltage (first voltage) to the base of the bias supplying transistor 301a. Specifically, for example, a constant current is supplied to a control signal terminal 601 (first current source). The control signal terminal 601 is connected to the base of the bias supplying transistor 301a.

The transistor 401b has a collector connected to the control signal terminal 601 and the base of the bias supplying transistor 301a, a base connected to this collector, and an emitter. Hereinafter, the connection between the collector of a transistor and the base of the same transistor is sometimes referred to as "diode connection".

The transistor 401a is diode-connected. The transistor 401a has a collector connected to the emitter of the transistor 401b and an emitter connected to the ground. The capacitor 401c has a first end part connected to the collector of the transistor 401b and a second end part connected to the ground. The capacitor 401c stabilizes the voltage of the collector of the transistor 401b.

Each of the transistors 401a and 401b functions as a diode. A voltage drop corresponding to two diodes occurs at the path between the collector and the emitter of the transistor 401b and the path between the collector and the emitter of the transistor 401a. That is to say, when the ground is used as the reference, the voltage of the collector of the transistor 401b is at a level of voltage corresponding to the voltage drop of two diodes. This voltage is applied to the base of the bias supplying transistor 301a.

The first stage bias circuit 312 includes a bias supplying transistor 302a (second bias supplying transistor) and a voltage applying circuit 412. The voltage applying circuit 412 includes transistors 402a (third transistor) and 402b (fourth transistor) and a capacitor 402c.

The first stage bias circuit 312 supplies the bias current Ibias2 to the base of the amplifying transistor 202a using the bias supplying transistor 302a that is connected to the base of the amplifying transistor 202a in an emitter-follower configuration.

Specifically, the bias supplying transistor 302a has a collector connected to the terminal Tb, a base, and an emitter connected to the first end part of the resistive element 202b.

The voltage applying circuit 412 supplies a bias at a predetermined level of voltage (second voltage) to the base of the bias supplying transistor 302a. Specifically, for example, a constant current is supplied to a control signal terminal 602 (second current source). The control signal terminal 602 is connected to the base of the bias supplying transistor 302a.

The transistor 402b is diode-connected. The transistor 402b has a collector connected to the base of the bias supplying transistor 302a and an emitter.

The transistor 402a is diode-connected and has a collector connected to the emitter of the transistor 402b and an emitter connected to the ground. The capacitor 402c has a first end part connected to the collector of the transistor 402b and a second end part connected to the ground. The capacitor 402c stabilizes the voltage of the collector of the transistor 402b.

When the ground is used as the reference, the voltage of the collector of the transistor 402b is at a level of voltage corresponding to the voltage drop of the transistors 402a and 402b, each of which serves as a diode. This voltage is applied to the base of the bias supplying transistor 302a.

A bias current control circuit 41 includes a bias current compensation transistor 51, and a low pass filter circuit 61. The low pass filter circuit 61 includes a capacitor 61a.

In response to a rise of the emitter voltage of the bias supplying transistor 301a, the bias current control circuit 41 allows part of an emitter current Ieef2 of the bias supplying circuit 302a to flow into the ground.

The capacitor 61a of the low pass filter circuit 61 has a first end part connected to the emitter of the bias supplying transistor 301a and a second end part connected to the ground.

The bias current compensation transistor 51 has a collector connected to the emitter of the bias supplying circuit 302a, a base connected to the emitter of the bias supplying transistor 301a, and an emitter connected to the ground.

Actions and Effects

Figure 2A:
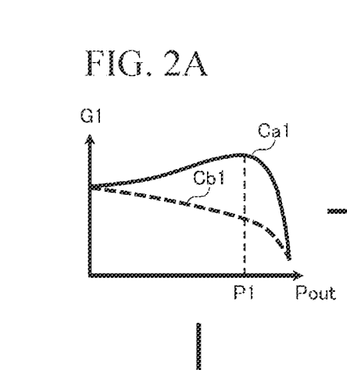
FIGS. 2A-2E are diagrams to illustrate an amplifying operation of the power amplifier circuit 101.
Figure 2B:
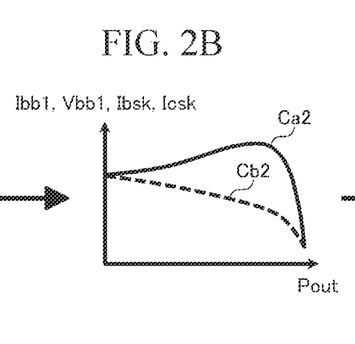
Figure 2C:
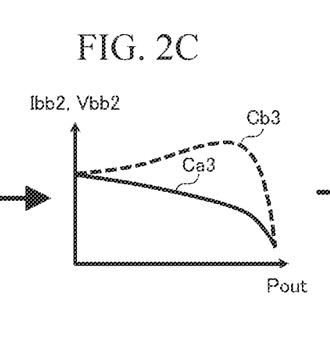
Figure 2D:
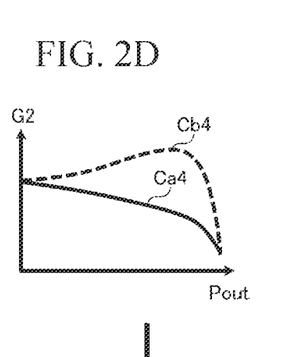
Figure 2E:
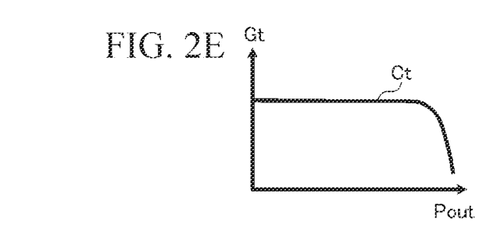

FIGS. 2A-2E are diagrams to illustrate the amplifying operation of the power amplifier circuit 101. The horizontal axis of each of the graphs in FIGS. 2A to 2E represent the output power Pout of the power amplifier circuit 101. The vertical axis of the graph in FIG. 2A represents the gain G1 of the final stage amplifier 201. The vertical axis of the graph in FIG. 2B represents the bias current Ibb1, the bias voltage Vbb1, the current Ibsk, or the current Icsk. The vertical axis of the graph in FIG. 2C represents the bias current Ibb2 or bias voltage Vbb2. The vertical axis of the graph in FIG. 2D represents the gain G2 of the first stage amplifier 202. The vertical axis of the graph in FIG. 2E represents the overall gain Gt of the power amplifier circuit 101.

The bias current Ibb1 is a current to be supplied from the final stage bias circuit 311 to the final stage amplifier 201. The bias voltage Vbb1 is the voltage of the emitter of the bias supplying transistor 301a. The bias current Ibb2 is a current to be supplied from the first stage bias circuit 312 to the first stage amplifier 202. The bias voltage Vbb2 is the voltage of the emitter of the bias supplying transistor 302a. The current Ibsk is a current obtained by subtracting the bias current Ibb1 from an emitter current Ieef1 of the bias supplying transistor 301a. The current Icsk is a current obtained by subtracting the bias current Ibb2 from the emitter current Ieef2 of the bias supplying transistor 302a.

For example, in the case where the bias current Ibb1 for the final stage amplifier 201 is reduced, as indicated by a curve Ca1, the gain G1 (graph in FIG. 2A) increases with an increase in the output power Pout when the output power Pout is less than P1 and decreases with an increase in the output power Pout when the output power Pout is greater than or equal to P1.

As described above, by reducing the bias current Ibb1, it becomes possible to reduce the power consumption of the final stage amplifier 201 when the output power Pout is small.

As illustrated in the graph in FIG. 2B, when the gain G1 changes like the curve Ca1, the bias current Ibb1 changes as indicated by a curve Ca2 that has a shape similar to that of the curve Ca1. The voltage drop of the resistive element 201b increases or decreases in response to an increase or decrease in the bias current Ibb1, and thus the bias voltage Vbb1 changes like the curve Ca2 as is the case with the bias current Ibb1.

The current Ibsk is the base current of the bias current compensation transistor 51 and thus increases or decreases in response to an increase or decrease in the bias voltage Vbb1. The current Icsk is the collector current of the bias current compensation transistor 51 and thus increases or decreases in response to an increase or decrease in the current Ibsk. That is to say, as is the case with the bias current Ibb1, the currents Ibsk and Icsk change like a curve Ca2.

When the current Icsk increases, the bias current Ibb2 decreases according to Kirchhoff's current law (see FIG. 1). Further, when the bias current Ibb2 decreases, the voltage drop of the resistive element 202b becomes smaller, and thus, the bias voltage Vbb2 also decreases. Accordingly, as indicated by the curve Ca3, the bias current Ibb2 and the bias voltage Vbb2 decrease with an increase in the output power Pout (graph in FIG. 2C).

Further, because of the decrease in the bias current Ibb2 and the bias voltage Vbb2, the bias supplied to the base of the amplifying transistor 202a decreases. Thus, as indicated by a curve Ca4, the gain G2 decreases with an increase in the output power Pout (graph in FIG. 2D).

On the other hand, as illustrated in the graph in FIG. 2A, for example, the gain G1 decreases with an increase in the output power Pout in some cases as indicated by a curve Cb1.

In this case, the bias current Ibb1, the bias voltage Vbb1, the current Ibsk, and the current Icsk change like a curve Cb2 that has a shape similar to that of the curve Cb1 (graph in FIG. 2B).

Further, the bias current Ibb2 and the bias voltage Vbb2 change like a curve Cb3 that has a shape similar to that of the curve Ca1 (graph in FIG. 2C). The gain G2 changes like a curve Cb4 that has a shape similar to that of the curve Ca1 (graph in FIG. 2D).

That is to say, the bias current compensation transistor 51 enables to perform the control in such a way that the change in the gain G2 relative to the output power Pout and the change in the gain G1 relative to the output power Pout are opposite to each other. This enables to suppress the change in the gain Gt relative to the output power Pout.

Further, when the amplifying transistor 201a amplifies a radio frequency signal, the bias voltage Vbb1 vibrates at a high frequency although the resistive element 201b can isolate in some degree.

When the high frequency vibration of the bias voltage Vbb1 is transmitted to the first stage amplifier 202 through the bias current control circuit 41, the power amplifier circuit 101 may oscillate, or the noise level of the output signal RFout may increase.

On the other hand, with the configuration in which the low pass filter circuit 61 is provided between the base of the bias current compensation transistor 51 and the resistive element 201b, it becomes possible to suppress the transmission of the high frequency vibration of the bias voltage Vbb1 to the first stage amplifier 202, and thus it becomes possible to facilitate the suppression of oscillation of the power amplifier circuit 101 and the reduction of noise level of the output signal RFout.

Note that the configuration is not limited to the one in which the base and collector of the bias current compensation transistor 51 are connected to the emitter of the bias supplying transistor 301a and the emitter of the bias supplying transistor 302a, respectively, and the configuration may alternatively be such that the base and collector of the bias current compensation transistor 51 are connected to the emitter of the bias supplying transistor 302a and the emitter of the bias supplying transistor 301a, respectively.

First Modified Example of Low Pass Filter Circuit 61

Figure 3:
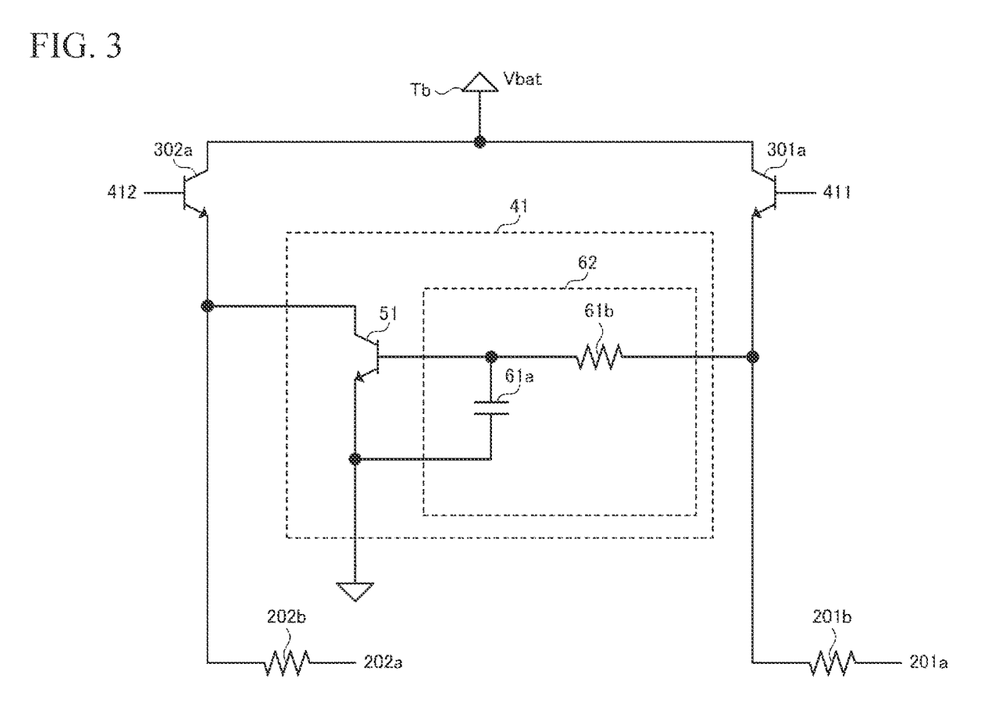
FIG. 3 is a diagram illustrating a first modified example of a low pass filter circuit 61.

FIG. 3 is a diagram illustrating a low pass filter circuit 62, which is a first modified example of the low pass filter circuit 61, and a peripheral circuit of the low pass filter circuit 62. As illustrated in FIG. 3, the low pass fit circuit 62 is different from the low pass filter circuit 61 illustrated in FIG. 1 in that a resistive element 61b is further provided.

The resistive element 61b of the low pass filter circuit 62 has a first end part connected to the emitter of the bias supplying transistor 301a and a second end part connected to the base of the bias current compensation transistor 51. The capacitor 61a has a first end part connected to the base of the bias current compensation transistor 51 and a second end part connected to the ground.

Second Modified Example of Low Pass Filter Circuit 61

Figure 4:
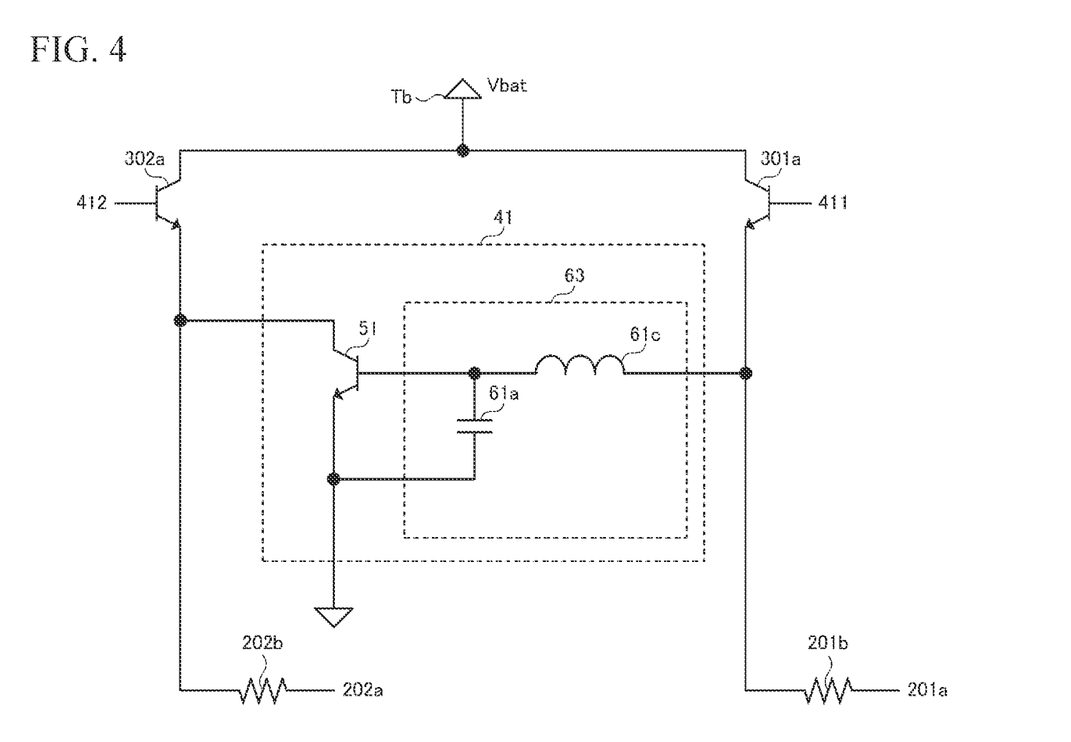
FIG. 4 is a diagram illustrating a second modified example of the low pass filter circuit 61.

FIG. 4 is a diagram illustrating a low pass filter circuit 63, which is a second modified example of the low pass filter circuit 61, and a peripheral circuit of the low pass filter circuit 63. As illustrated in FIG. 4, the low pass fit circuit 63 is different from the low pass filter circuit 61 illustrated in FIG. 1 in that an inductor 61c is further provided.

The inductor 61c of the low pass filter circuit 63 has a first end part connected to the emitter of the bias supplying transistor 301a and a second end part connected to the base of the bias current compensation transistor 51. The capacitor 61a has a first end part connected to the base of the bias current compensation transistor 51 and a second end part connected to the ground.

Second Embodiment

A power amplifier circuit according to the second embodiment is described. In the description of the second embodiment and subsequent embodiments, descriptions regarding matters common to the first embodiment will be omitted, and only points different from the first embodiment will be described. Particularly, similar actions and effects of similar constituent elements will not be repeated in each embodiment.

Figure 5:
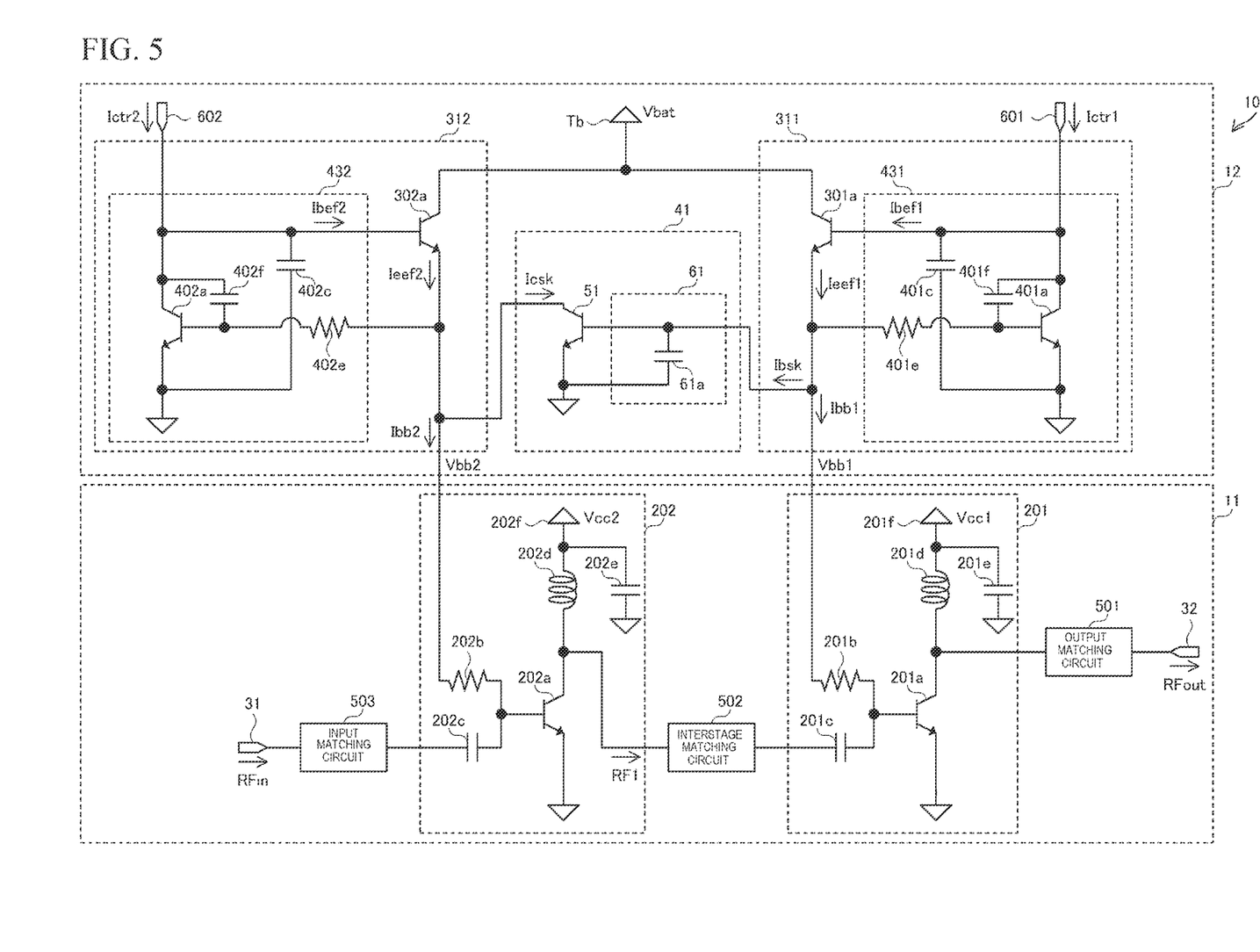
FIG. 5 is a circuit diagram of a power amplifier circuit 103.

FIG. 5 is a circuit diagram of a power amplifier circuit 103. As illustrated in FIG. 5, the power amplifier circuit 103 according to the second embodiment is different from the power amplifier circuit 101 according to the first embodiment in that the final stage bias circuit 311 and the first stage bias circuit 312 are each formed as a negative feedback bias circuit.

Compared with the bias part 12 illustrated in FIG. 1, the bias part 12 of the power amplifier circuit 103 includes a voltage applying circuits 431 (first voltage applying circuit) and 432 (second voltage applying circuit) instead of the voltage applying circuits 411 and 412, respectively.

Compared with the voltage applying circuit 411 illustrated in FIG. 1, instead of the transistor 401b, the voltage applying circuit 431 includes a resistive element 401e (first negative feedback resistive element) and a capacitor 401f (first capacitor). The resistive element 401e has a first end part connected to the emitter of the bias supplying transistor 301a and a second end part.

The transistor 401a has a collector connected to the control signal terminal 601 and the base of the bias supplying transistor 301a, a base connected to the second end part of the resistive element 401e, and an emitter connected to the ground. The capacitor 401f has a first end part connected to the collector of the transistor 401a and a second end part connected to the base of the transistor 401a.

Compared with the voltage applying circuit 412 illustrated in FIG. 1, instead of the transistor 402b, the voltage applying circuit 432 includes a resistive element 402e (second negative feedback resistive element) and a capacitor 402f (second capacitor). The resistive element 402e has a first end part connected to the emitter of the bias supplying transistor 302a and a second end part.

The transistor 402a has a collector connected to the control signal terminal 602 and the base of the bias supplying transistor 302a, a base connected to the second end part of the resistive element 402e, and an emitter connected to the ground. The capacitor 402f has a first end part connected to the collector of the transistor 402a and a second end part connected to the base of the transistor 402a.

The voltage applying circuit 431 has the configuration similar to that of the voltage applying circuit 432. Thus, in the following section, the operation of the voltage applying circuit 431 is described as a representative case, and the description of the operation of the voltage applying circuit 432 is omitted.

In the final stage bias circuit 311, the bias supplying transistor 301a, the resistive element 401e, and the transistor 401a form a negative feedback path. With this negative feedback path, the rise and fall of the emitter potential of the bias supplying transistor 301a, that is to say, the rise and fall of the bias voltage Vbb1 are both reduced.

Further, in the final stage bias circuit 311, when a constant current Ictrl is supplied from the control signal terminal 601, the base potential of the bias supplying transistor 301a rises, and the bias supplying transistor 301a is turned to ON state. When the bias supplying transistor 301a is turned to ON state, the transistor 401a is turned to ON state.

In the power amplifier circuit 103, when the ground is used as the reference, the potential of the collector of the transistor 401a is substantially equal to the potential obtained by adding the base-emitter voltage (Vbe) of the transistor 401a and Vbe of the bias supplying transistor 301a.

On the other hand, in the power amplifier circuit 102 (see FIG. 6) which will be described below, when the ground is used as the reference, the potential of the collector of the transistor 401a is substantially equal to Vbe of the transistor 401a.

That is to say, in the power amplifier circuit 103, it becomes possible to increase the collector potential of the transistor 401a from Vbe to 2×Vbe. This enables to increase the gain of the transistor 401a, and thus, it becomes possible to further reduce the rise and fall of the bias voltage Vbb1 caused by the negative feedback.

Further, in the power amplifier circuit 103, the transistors 401b and 402b of the power amplifier circuit 101 (see FIG. 1) are not provided, and thus it becomes possible to reduce the circuit size. This enables to reduce the size of the power amplifier circuit 103, and further, this enables to reduce the cost of the power amplifier circuit 103.

Third Embodiment

Figure 6:
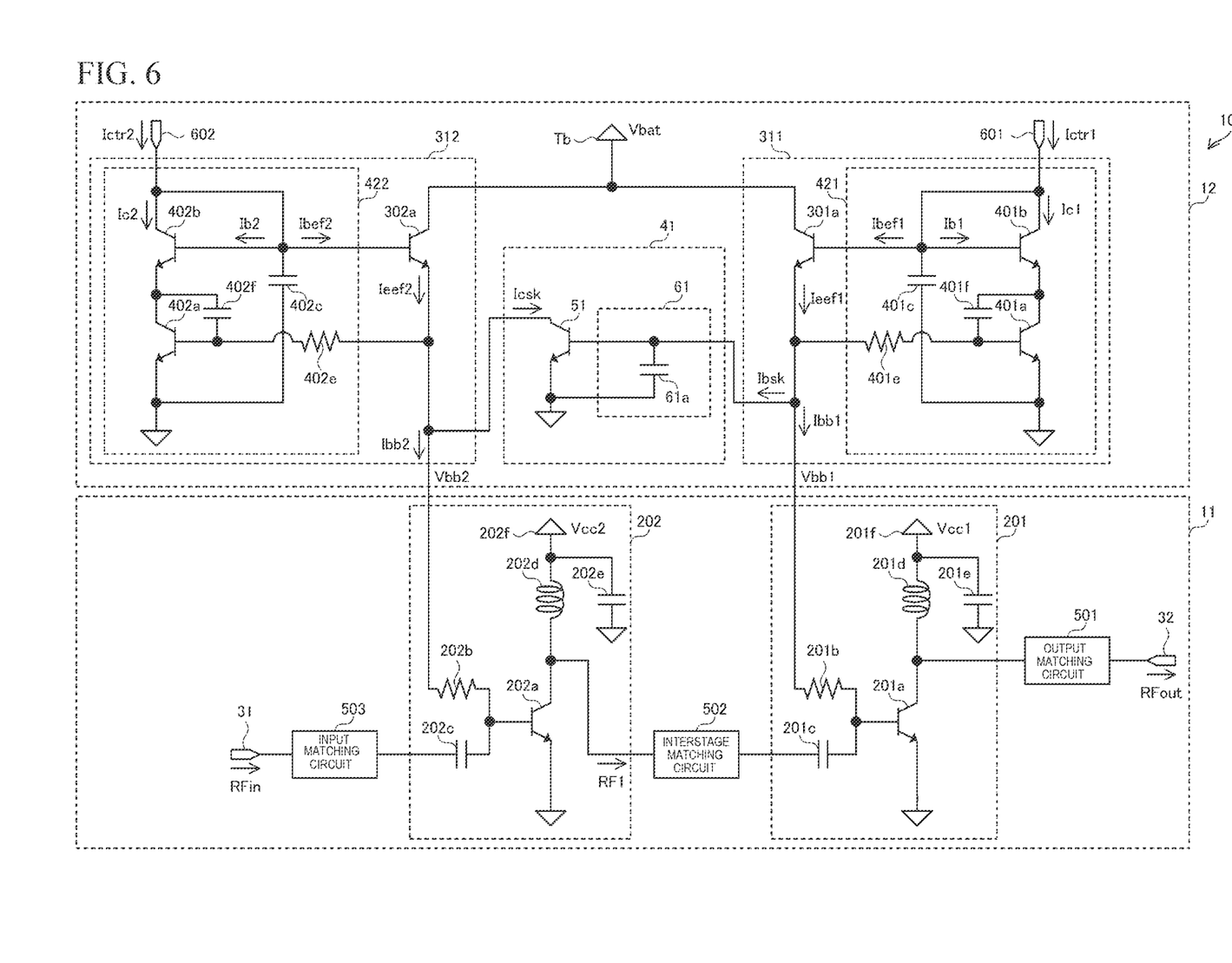
FIG. 6 is a circuit diagram of a power amplifier circuit 102.

A power amplifier circuit 102 according to the third embodiment is described. FIG. 6 is a circuit diagram of a power amplifier circuit 102. As illustrated in FIG. 6, the power amplifier circuit 102 according to the third embodiment is different from the power amplifier circuit 101 according to the first embodiment in that the final stage bias circuit 311 and the first stage bias circuit 312 are each a negative feedback bias circuit.

Compared with the bias part 12 illustrated in FIG. 1, the bias part 12 of the power amplifier circuit 102 includes a voltage applying circuits 421 (first voltage applying circuit) and 422 (second voltage applying circuit) instead of the voltage applying circuits 411 and 412, respectively.

Compared with the voltage applying circuit 411 illustrated in FIG. 1, the voltage applying circuit 421 further includes the resistive element 401e (first negative feedback resistive element) and the capacitor 401f (first capacitor). The resistive element 401e has a first end part connected to the emitter of the bias supplying transistor 301a and a second end part.

The transistor 401a has a collector connected to the emitter of the transistor 401b, a base connected to the second end part of the resistive element 401e, and an emitter connected to the ground. The capacitor 401f has a first end part connected to the collector of the transistor 401a and a second end part connected to the base of the transistor 401a.

Compared with the voltage applying circuit 412 illustrated in FIG. 1, the voltage applying circuit 422 further includes the resistive element 402e (second negative feedback resistive element) and the capacitor 402f (second capacitor). The resistive element 402e has a first end part connected to the emitter of the bias supplying transistor 302a and a second end part.

The transistor 402a has a collector connected to the emitter of the transistor 402b, a base connected to the second end part of the resistive element 402e, and an emitter connected to the ground. The capacitor 402f has a first end part connected to the collector of the transistor 402a and a second end part connected to the base of the transistor 402a.

The voltage applying circuit 421 has the configuration similar to that of the voltage applying circuit 422. Thus, in the following section, the operation of the voltage applying circuit 421 is described as a representative case, and the description of the operation of the voltage applying circuit 422 is omitted.

In the final stage bias circuit 311, the bias supplying transistor 301a, the resistive element 401e, and the transistors 401a and 401b form a negative feedback path. With this negative feedback path, the rise and fall of the emitter potential of the bias supplying transistor 301a, that is to say, the rise and fall of the bias voltage Vbb1 are both reduced.

Specifically, when the bias voltage Vbb1 rises, the base potential of the transistor 401a rises, and the base current of the transistor 401a increases. This increases the collector current of the transistor 401a and a collector current Ic1 of the transistor 401b.

Further, a base current Ibef1 of the bias supplying transistor 301a is a current obtained by subtracting the collector current Ic1 of the transistor 401b and a base current Ib1 of the transistor 401b from the constant current Ictrl supplied from the control signal terminal 601. That is to say, Ibef1=Ictrl−Ic1−Ib1. Here, Ib1=Ic1/β, and thus, Ibef1=Ictrl−Ic1×(1+1/β) where β is the grounded emitter current amplification factor.

The constant current Ictrl is constant. Thus, when the collector current Ic1 increases, the base current Ibef1 decreases, and furthermore, the emitter current Ieef1 of the bias supplying transistor 301a decreases. This reduces the voltage drop of the resistive element 201b and causes the bias voltage Vbb1 to fall.

On the other hand, when the bias voltage Vbb1 falls, the collector current Ic1 decreases, and furthermore, the base current Ibef1 increases. This increases the emitter current Ieef1. Thus, the voltage drop of the resistive element 201b becomes greater, and the bias voltage Vbb1 rises.

As described above, with the configuration that adjusts the base current Ibef1 in such a manner as to suppress the rise and fall of the bias voltage Vbb1, the voltage applying circuit 421 enables to reduce the amount of compensation achieved by the bias current control circuit 41. This enables to further suppress the change in the overall gain of the power amplifier circuit 101.

Further, with the configuration that connects the capacitor 401f between the collector of the transistor 401a and the base of the transistor 401a, it becomes possible to ground the base of the transistor 401a AC-wise through the collector of the transistor 401a.

When the power of the input signal RFin is high, in some cases, a radio frequency signal flows into the final bias circuit 311 from the final stage amplifier 201. In such a case, it becomes possible to cause the radio frequency signal to flow into the ground through the capacitor 401f and the transistor 401a, and this enables to suppress an impact of the radio frequency signal on the base current of the transistor 401a. That is to say, it becomes possible to hinder the transistor 401a from amplifying the radio frequency signal. This enable to suppress oscillation of the radio frequency signal in the negative feedback path or generation of noise. Note that a configuration without necessarily the capacitor 401f may alternatively be used.

Fourth Embodiment

Figure 7:
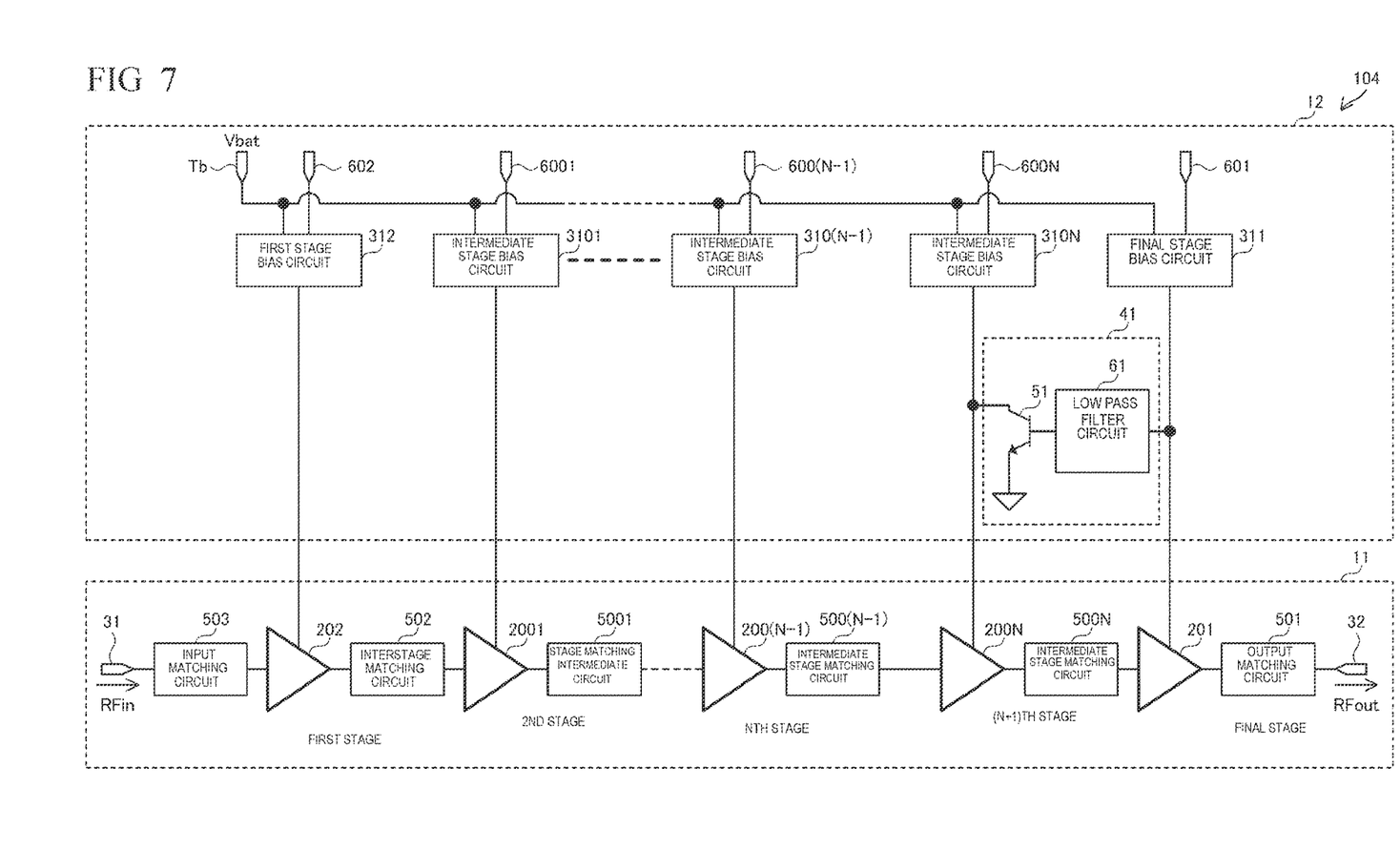
FIG. 7 is a circuit diagram of a power amplifier circuit 104.

A power amplifier circuit 104 according to the fourth embodiment is described. FIG. 7 is a circuit diagram of the power amplifier circuit 104. As illustrated in FIG. 7, the power amplifier circuit 104 according to the fourth embodiment is different from the power amplifier circuit 101 according to the first embodiment in including three or more sets of the amplifier, the bias circuit, and the matching circuit.

Compared with the power amplifier circuit 101 illustrated in FIG. 1, the power amplifier circuit 104 further includes N number of intermediate stage amplifiers 2001 to 200N, N number of intermediate stage bias circuits 3101 to 310N, and N number of intermediate stage matching circuits 5001 to 500N. Here, N is an integer greater than or equal to 1.

Each of the intermediate stage amplifiers 2001 to 200N has a configuration substantially similar to that of the final stage amplifier 201 or the first stage amplifier 202. Each of the intermediate stage bias circuits 3101 to 310N has a configuration substantially similar to that of the final stage bias circuit 311 or the first stage bias circuit 312. Each of the intermediate stage matching circuits 5001 to 500N has a configuration substantially similar to that of the output matching circuit 501 or the interstage matching circuit 502.

The intermediate stage amplifiers 2001 to 200N are cascade-connected in this order between the first stage amplifier 202 and the final stage amplifier 201. Here, the term "cascade-connected" means that a plurality of amplifiers are connected in series and further, of two adjacent amplifiers, an output terminal of one of the amplifiers is connected to an input terminal of the other amplifier.

In the following section, the intermediate stage amplifier 200N, the intermediate bias circuit 310N, and the intermediate stage matching circuit 500N may sometimes be referred to as the (N+1)th stage amplifier, the (N+1)th bias circuit, and the (N+1)th stage matching circuit, respectively. Note that the first stage and the (N+2)th stage are the first stage and the final stage, respectively.

The intermediate stage bias circuit 310 (N−1) supplies a bias to the intermediate stage amplifier 200 (N−1). The intermediate stage amplifier 200 (N−1) has an input terminal connected to an output terminal of the (N−1)th stage amplifier through the (N−1)th stage matching circuit and an output terminal connected to an input terminal of the (N+1)th stage amplifier through the Nth stage matching circuit, that is to say, the intermediate stage matching circuit 500 (N−1).

The bias current compensation transistor 51 has a collector connected to the emitter of the bias supplying transistor of the intermediate stage bias circuit 310N, a base connected to the emitter of the bias supplying transistor 301a of the final stage bias circuit 311 through the low pass filter circuit 61, and an emitter connected to the ground.

Fifth Embodiment

Figure 8:
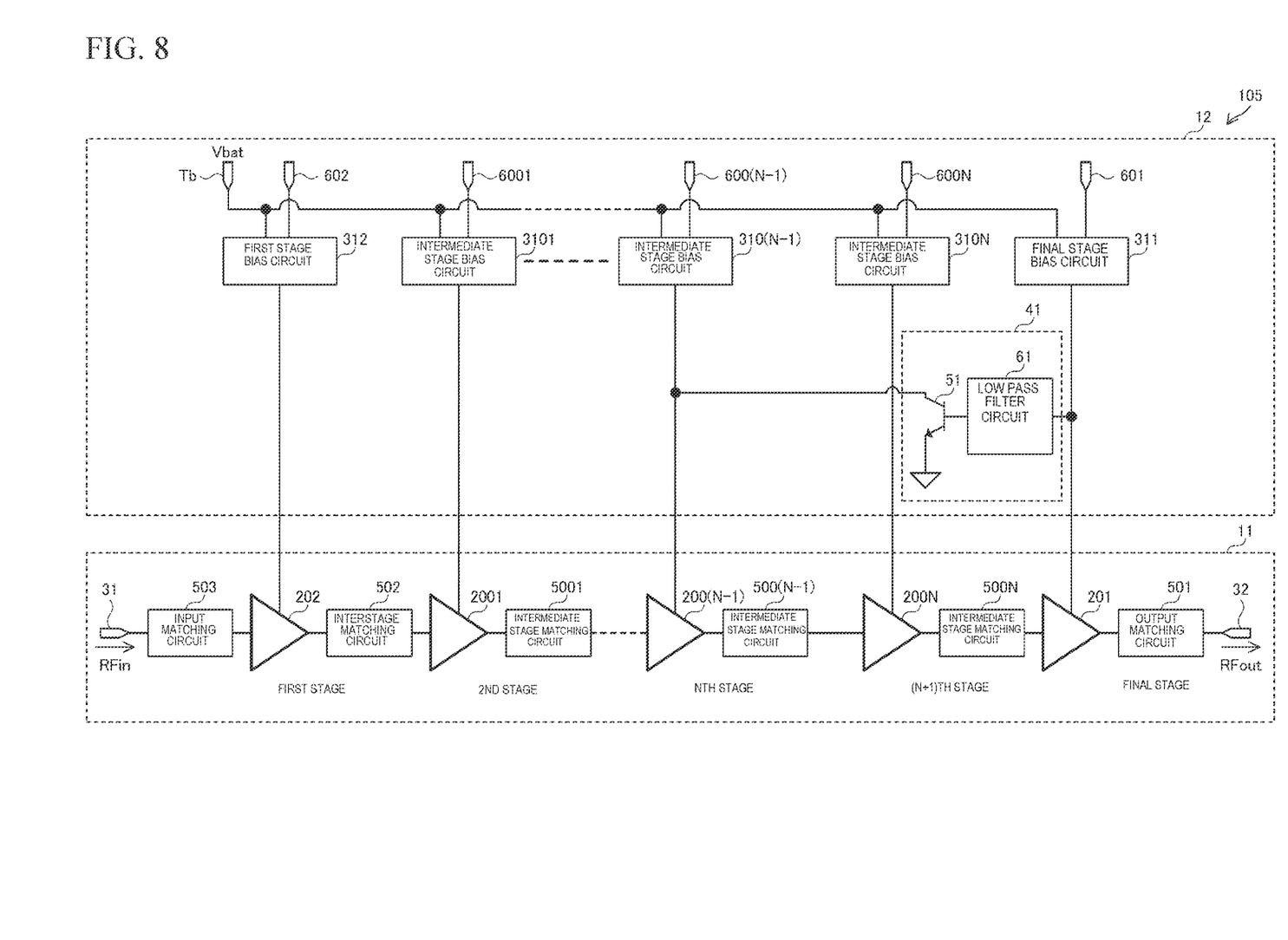
FIG. 8 is a circuit diagram of a power amplifier circuit 105.

A power amplifier circuit 105 according to the fifth embodiment is described. FIG. 8 is a circuit diagram of the power amplifier circuit 105. As illustrated in FIG. 8, the power amplifier circuit 105 according to the fifth embodiment is different from the power amplifier circuit 104 according to the fourth embodiment in that the bias current control circuit 41 is provided between the output terminal of the final stage bias circuit 311 and the output terminal of the bias circuit that is located closer to the input side than the intermediate stage bias circuit 310N.

In the present embodiment, the bias current compensation transistor 51 has a collector connected to the emitter of the bias supplying transistor of the intermediate stage bias circuit 310 (N−1), a base connected to the emitter of the bias supplying transistor 301a of the final stage bias circuit 311 through the low pass filter circuit 61, and an emitter connected to the ground.

Note that the configuration may alternatively be such that the collector of the bias current compensation transistor 51 is connected to the emitter of the bias supplying transistor of the bias circuit that is located closer to the input side than the intermediate stage bias circuit 310 (N−1) such as the (N−1)th stage bias circuit, the (N−2)th stage bias circuit, or the like.

Further, in the power circuits 104 and 105, the configuration is described, in which the base of the bias current compensation transistor 51 is connected to the emitter of the bias supplying transistor 301a of the final stage bias circuit 311. However, the configuration is not limited thereto. The configuration may alternatively be such that the base of the bias current compensation transistor 51 is connected to the emitter of the bias supplying transistor of any one of the N number of bias circuits from the second stage bias circuit, that is to say, the intermediate stage bias circuit 3101, to the intermediate bias circuit 310N.

Further, in the power amplifier circuits 101 to 105, the configuration in which the low pass filter circuit 61 is provided is described. However, the configuration is not limited thereto. In the power amplifier circuits 101 to 105, a configuration without necessarily the low pass filter circuit 61 may alternatively be used.

Exemplary embodiments of the present disclosure have been described. The power amplifier circuits 101 to 105 each includes a plurality of amplifying transistors that are electrically cascade-connected and include at least the amplifying transistors 201a and 202a. Each of this plurality of amplifying transistors amplifies a signal supplied to the base thereof and outputs an amplified signal, and in the power amplifier circuits 101 to 103, the resistive element 201b has the first end part and the second end part connected to the base of the amplifying transistor 201a. The resistive element 202b has the first end part and the second end part connected to the base of the amplifying transistor 202a. The bias supplying transistor 301a has the emitter connected to the first end part of the resistive element 201b. The bias supplying transistor 302a has the emitter connected to the first end part of the resistive element 202b. The bias current compensation transistor 51 has the base connected to the first end part of the resistive element 201b, the collector connected to the first end part of the resistive element 202b, and the emitter connected to the ground.

As described above, with the configuration in which the base of the bias current compensation transistor 51 is connected to the first end part of the resistive element 201b, that is to say, the emitter of the bias supplying transistor 301a, it becomes possible to cause the bias current compensation transistor 51 to operate based on the emitter potential of the bias supplying transistor 301a, that is to say, the bias voltage Vbb1. The bias current compensation transistor 51 enables to increase or decrease the current Icsk that flows from the emitter of the bias supplying transistor 302a into the ground in response to an increase or decrease in the gain of the amplifying transistor 201a without necessarily being affected by nonlinearity of the bias supplying transistor 301a. Because of this, it becomes possible to realize the negative feedback that reduces the gain of the amplifying transistor 202a when the gain of the amplifying transistor 201a increases and increases the gain of the amplifying transistor 202a when the gain of the amplifying transistor 201a decreases, and thus, it becomes possible to fully compensate the gain change of the amplifying transistor 201a. Therefore, it becomes possible to suppress the change in the overall gain of the power amplifier circuit.

Further, it becomes possible to drive the amplifying transistor 201a and the bias supplying transistor 301a by applying a voltage that is approximately equal to the sum of Vbe of the amplifying transistor 201a and Vbe of the bias supplying transistor 301a to the collector of the bias supplying transistor 301a. The same applies to the amplifying transistor 202a and the bias supplying transistor 302a.

Accordingly, it becomes possible to operate the power amplifier circuits 101 to 103 at low voltage.

Further, in the power amplifier circuit 103, the voltage applying circuit 431 is electrically connected to the base of the bias supplying transistor 301a and applies the first voltage to the base of the bias supplying transistor 301a. In the voltage applying circuit 431, the resistive element 401e has the first end part connected to the emitter of the bias supplying transistor 301a and the second end part. The transistor 401a has the base connected to the second end part of the resistive element 401e, the collector connected to the base of the bias supplying transistor 301a and the control signal terminal 601, and the emitter connected to the ground.

According to such configuration, it becomes possible to form the negative feedback path from the bias supplying transistor 301a, the resistive element 401e, and the transistor 401a. Such a negative feedback path enables the adjustment of the base current Ibef1 of the bias supplying transistor 301a in such a manner as to suppress the rise and fall of the emitter potential of the bias supplying transistor 301a, that is to say, the bias voltage Vbb1. This enables to reduce the amount of compensation achieved by the bias current compensation transistor 51, and thus, it becomes possible to further suppress the change in the overall gain of the power amplifier circuit 103. Further, it becomes possible to set the collector potential of the transistor 401a to a high voltage that is the sum of Vbe of the transistor 401a and Vbe of the bias supplying transistor 301a, and thus, the gain of the transistor 401a can be increased. This enables to further reduce the rise and fall of the bias voltage Vbb1 caused by the negative feedback. Further, it becomes possible to eliminate one of the transistors compared with the voltage applying circuits 411 and 421, and thus it becomes possible to reduce the circuit size. This enables to reduce the size of the power amplifier circuit 103, and further, this enables to reduce the cost of the power amplifier circuit 103.

Further, in the power amplifier circuit 102, the voltage applying circuit 421 is electrically connected to the base of the bias supplying transistor 301a and applies the first voltage to the base of the bias supplying transistor 301a. In the voltage applying circuit 421, the resistive element 401e has the first end part connected to the emitter of the bias supplying transistor 301a and the second end part. The transistor 401a has the base connected to the second end part of the resistive element 401e, the collector, and the emitter connected to the ground. The transistor 401b has the collector and the base that are connected to the base of the bias supplying transistor 301a and the control signal terminal 601 and the emitter connected to the collector of the transistor 401a.

According to such configuration, it becomes possible to form the negative feedback path from the bias supplying transistor 301a, the resistive element 401e, and the transistors 401a and 401b. Such a negative feedback path enables the adjustment of the base current Ibef1 of the bias supplying transistor 301a in such a manner as to suppress the rise and fall of the emitter potential of the bias supplying transistor 301a, that is to say, the bias voltage Vbb1. This enables to reduce the amount of compensation achieved by the bias current compensation transistor 51, and thus, it becomes possible to further suppress the change in the overall gain of the power amplifier circuit 102.

Further, in the voltage applying circuits 421 and 431, the capacitor 401f is connected between the base of the transistor 401a and the collector of the transistor 401a.

Such configuration enables the base of the transistor 401a to be grounded AC-wise through the collector of the transistor 401a. Because of this, for example, even in the case where a radio frequency signal flows from the final stage amplifier 201 into the final stage bias circuit 311, it becomes possible to cause that radio frequency signal to flow into the ground through the capacitor 401f and the transistor 401a, and thus, it becomes possible to suppress an impact of the radio frequency signal on the base current of the transistor 401a. That is to say, it becomes possible to hinder the transistor 401a from amplifying the radio frequency signal. This enable to suppress oscillation of the radio frequency signal in the negative feedback path or generation of noise.

Further, in the power amplifier circuit 103, the voltage applying circuit 432 is electrically connected to the base of the bias supplying transistor 302a and applies the second voltage to the base of the bias supplying transistor 302a. In the voltage applying circuit 432, the resistive element 402e has the first end part connected to the emitter of the bias supplying transistor 302a and the second end part. The transistor 402a has the base connected to the second end part of the resistive element 402e, the collector connected to the base of the bias supplying transistor 302a and the control signal terminal 602, and the emitter connected to the ground.

According to such configuration, it becomes possible to form the negative feedback path from the bias supplying transistor 302a, the resistive element 402e, and the transistor 402a. Such a negative feedback path enables the adjustment of the base current Ibef2 of the bias supplying transistor 302a in such a manner as to suppress the rise and fall of the emitter potential of the bias supplying transistor 302a, that is to say, the bias voltage Vbb2. This enables to reduce the amount of compensation achieved by the bias current compensation transistor 51, and thus, it becomes possible to further suppress the change in the overall gain of the power amplifier circuit 103. Further, it becomes possible to set the collector potential of the transistor 402a to a high voltage that is the sum of Vbe of the transistor 402a and Vbe of the bias supplying transistor 302a, and thus, the gain of the transistor 402a can be increased. This enables to further reduce the rise and fall of the bias voltage Vbb2 caused by the negative feedback. Further, it becomes possible to reduce one of the transistors compared with the voltage applying circuits 412 and 422, and thus it becomes possible to reduce the circuit size. This enables to reduce the size of the power amplifier circuit 103, and further, this enables to reduce the cost of the power amplifier circuit 103.

Further, in the power amplifier circuit 102, the voltage applying circuit 422 is electrically connected to the base of the bias supplying transistor 302a and applies the second voltage to the base of the bias supplying transistor 302a. In the voltage applying circuit 422, the resistive element 402e has the first end part connected to the emitter of the bias supplying transistor 302a and the second end part. The transistor 402a has the base connected to the second end part of the resistive element 402e, the collector, and the emitter connected to the ground. The transistor 402b has the collector and the base that are connected to the base of the bias supplying transistor 302a and the control signal terminal 602 and the emitter connected to the collector of the transistor 402a.

According to such configuration, it becomes possible to form the negative feedback path from the bias supplying transistor 302a, the resistive element 402e, and the transistors 402a and 402b. Such a negative feedback path enables the adjustment of the base current Ibef2 of the bias supplying transistor 302a in such a manner as to suppress the rise and fall of the emitter potential of the bias supplying transistor 302a, that is to say, the bias voltage Vbb2. This enables to reduce the amount of compensation achieved by the bias current compensation transistor 51, and thus, it becomes possible to further suppress the change in the overall gain of the power amplifier circuit 102.

Further, in the voltage applying circuits 422 and 432, the capacitor 402f is connected between the base of the transistor 402a and the collector of the transistor 402a.

Such configuration enables the base of the transistor 402a to be grounded AC-wise through the collector of the transistor 402a. For example, even in the case where a radio frequency signal flows from the first stage amplifier 202 into the first stage bias circuit 312, this enables to cause that radio frequency signal to flow into the ground through the capacitor 402f and the transistor 402a, and thus, it becomes possible to suppress an impact of the radio frequency signal on the base current of the transistor 402a. That is to say, it becomes possible to hinder the transistor 402a from amplifying the radio frequency signal. This enable to suppress oscillation of the radio frequency signal in the negative feedback path or generation of noise.

Further, in the power amplifier circuits 101 to 105, the amplifying transistor 201a is the final stage amplifying transistor.

Such configuration enables the bias current compensation transistor 51 to operate based on the bias voltage Vbb1 for the final stage amplifying transistor 201a whose gain is easy to increase. This enables to suppress the change in the overall gain of the power amplifier circuit effectively.

Further, the power amplifier circuit 105 includes (N+2) number of the amplifiers. The amplifier in the Nth stage, the (N−1)th stage, the (N−2)th stage, or the like is connected to the final stage amplifier 201 through one or more amplifiers.

As described above, with the configuration in which the bias current compensation transistor 51 is connected between the emitter of the bias supplying transistor connected to the final stage amplifier 201 and the emitter of the bias supplying transistor connected to the amplifier in the stage where the bias current is smaller, such as the Nth stage, the (N−1)th stage, the (N−2)th stage, or the like, it becomes possible to reduce the amount of compensation achieved by the bias current compensation transistor 51 while keeping the effect of suppressing the change in the overall gain of the power amplifier circuit 105.

Further, in the power amplifier circuits 101 to 105, the low pass filter circuit 61 is connected between the first end part of the resistive element 202b and the base of the bias current compensation transistor 51.

Even in the case where the bias voltage Vbb1 vibrates at a high frequency, such configuration enables to suppress the transmission of the high frequency vibration of the bias voltage Vbb1 to the first stage amplifier 202, and thus, it becomes possible to suppress oscillations of the power amplifier circuits 101 to 105 and reduce the noise level in the output signal RFout.

Note that each of the embodiments described above is provided to facilitate understanding of the present disclosure and is not to be construed as limiting the present disclosure. The present disclosure can be modified or improved without necessarily departing from its spirit, and the present disclosure also includes equivalents thereof. That is to say, ones obtained by suitably modifying designs of the respective embodiments by those skilled in the art are also included within the scope of the present disclosure as long as they include features of the present disclosure. For example, each constituent element included in each embodiment as well as its arrangement, material, condition, shape, size, and the like are not limited to those exemplified, and may be suitably changed. Needless to say, each embodiment is for illustrative purposes only, and constituent elements illustrated in different embodiments may be combined or partially exchanged. Resulting embodiments are also included in the scope of the present disclosure so long as the characteristic features of the present disclosure are included. Further, the meaning of "connect" includes "direct or indirect connection" and "electrical connection".

What is claimed is:

1. A power amplifier circuit comprising:
   a plurality of amplifying transistors comprising a first amplifying transistor and a second amplifying transistor, the plurality of amplifying transistors being electrically cascade-connected, each of the plurality of amplifying transistors being configured to amplify a signal supplied to a base or gate thereof and to output an amplified signal;
   a first resistive circuit element having a first end, and a second end connected to the base or gate of the first amplifying transistor;
   a second resistive circuit element having a first end, and a second end connected to the base or gate of the second amplifying transistor;
   a first bias supplying transistor having an emitter or source connected to the first end of the first resistive circuit element;
   a second bias supplying transistor having an emitter or source connected to the first end of the second resistive circuit element; and
   a bias current compensation transistor having a base or gate connected to the first end of the first resistive circuit element, a collector or drain connected to a node between the emitter or source of the second bias supplying transistor and the first end of the second resistive circuit element, and an emitter or source connected to ground.

2. The power amplifier circuit according to claim 1, further comprising:
   a first voltage applying circuit that is electrically connected to a base or gate of the first bias supplying transistor and that is configured to apply a first voltage to the base or gate of the first bias supplying transistor,
   wherein the first voltage applying circuit comprises:
      a first negative feedback resistive circuit element having a first end connected to the emitter or source of the first bias supplying transistor, and a second end, and
      a first transistor having a base or gate connected to the second end of the first negative feedback resistive circuit element, a collector or drain connected to a first current source and to the base or gate of the first bias supplying transistor, and an emitter or source connected to ground.

3. The power amplifier circuit according to claim 1, further comprising:
   a first voltage applying circuit that is electrically connected to a base or gate of the first bias supplying transistor and that is configured to apply a first voltage to the base or gate of the first bias supplying transistor,
   wherein the first voltage applying circuit comprises:
      a first negative feedback resistive circuit element having a first end connected to the emitter or source of the first bias supplying transistor, and a second end,
      a first transistor having a base or gate connected to the second end of the first negative feedback resistive circuit element, a collector or drain, and an emitter or source connected to ground, and a second transistor having a collector or drain connected to the base or gate of the first bias supplying transistor and to a first current source, and an emitter or source connected to the collector or drain of the first transistor, the second transistor being diode-connected.

4. The power amplifier circuit according to claim 2, wherein the first voltage applying circuit further comprises a first capacitor connected between the base or gate of the first transistor, and the collector or drain of the first transistor.

5. The power amplifier circuit according to claim 1, further comprising:
a second voltage applying circuit that is electrically connected to a base or gate of the second bias supplying transistor and that is configured to apply a second voltage to the base or gate of the second bias supplying transistor,
wherein the second voltage applying circuit comprises:
a second negative feedback resistive circuit element having a first end connected to the emitter or source of the second bias supplying transistor, and a second end, and
a third transistor having a base or gate connected to the second end of the second negative feedback resistive circuit element, a collector or drain connected to a second current source and to the base or gate of the second bias supplying transistor, and an emitter or source connected to ground.

6. The power amplifier circuit according to claim 1, further comprising:
a second voltage applying circuit that is electrically connected to a base or gate of the second bias supplying transistor and that is configured to apply a second voltage to the base or gate of the second bias supplying transistor,
wherein the second voltage applying circuit comprises:
a second negative feedback resistive circuit element having a first end connected to the emitter or source of the second bias supplying transistor, and a second end,
a third transistor having a base or gate connected to the second end of the second negative feedback resistive circuit element, a collector or drain, and an emitter or source connected to ground, and
a fourth transistor having a collector or drain connected to the base or gate of the second bias supplying transistor and to a second current source, and an emitter or source connected to the collector or drain of the third transistor, the fourth transistor being diode-connected.

7. The power amplifier circuit according to claim 5, wherein the second voltage applying circuit further comprises a second capacitor connected between the base or gate of the third transistor, and the collector or drain of the third transistor.

8. The power amplifier circuit according to claim 6, wherein the second voltage applying circuit further comprises a second capacitor connected between the base or gate of the third transistor, and the collector or drain of the third transistor.

9. The power amplifier circuit according to claim 1, wherein the first amplifying transistor is a final stage amplifying transistor.

10. The power amplifier circuit according to claim 1, wherein:
the plurality of amplifying transistors comprises three or more amplifying transistors, and
the second amplifying transistor is connected to the first amplifying transistor through at least one other of the three or more amplifying transistors.

11. The power amplifier circuit according to claim 9, wherein:
the plurality of amplifying transistors comprises three or more amplifying transistors, and
the second amplifying transistor is connected to the first amplifying transistor through at least one other of the three or more amplifying transistors.

12. The power amplifier circuit according to claim 1, further comprising:
a low pass filter circuit connected between the first end of the first resistive circuit element, and the base or gate of the bias current compensation transistor.

* * * * *